United States Patent
Moon et al.

(10) Patent No.: US 10,797,239 B2
(45) Date of Patent: Oct. 6, 2020

(54) METHOD FOR MANUFACTURING SEMICONDUCTOR DEVICE

(71) Applicant: SK hynix Inc., Icheon (KR)

(72) Inventors: Joo Young Moon, Yongin (KR); Young Seok Ko, Suwon (KR); Soo Gil Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/413,491

(22) Filed: May 15, 2019

(65) Prior Publication Data

US 2020/0144500 A1    May 7, 2020

(30) Foreign Application Priority Data

Nov. 1, 2018 (KR) .......................... 10-2018-0132751

(51) Int. Cl.
*H01L 45/00* (2006.01)

(52) U.S. Cl.
CPC .......... *H01L 45/1666* (2013.01); *H01L 45/06* (2013.01); *H01L 45/12* (2013.01); *H01L 45/144* (2013.01); *H01L 45/145* (2013.01)

(58) Field of Classification Search
None
See application file for complete search history.

(56) References Cited

U.S. PATENT DOCUMENTS

| 7,579,278 | B2 | 8/2009 | Sandhu |
| 7,811,940 | B2 | 10/2010 | Sandhu |
| 7,998,837 | B2 | 8/2011 | Kang |
| 2007/0224823 | A1 | 9/2007 | Sandhu |
| 2011/0159663 | A1 | 6/2011 | Kang |
| 2020/0144500 | A1* | 5/2020 | Moon ................. H01L 45/1666 |

FOREIGN PATENT DOCUMENTS

KR    101096263    12/2011

\* cited by examiner

*Primary Examiner* — Jack S Chen

(57) ABSTRACT

A method for forming a semiconductor device is disclosed. The method for forming the semiconductor device includes forming a first sacrificial film over a target layer to be etched, forming a first partition mask over the first sacrificial film, forming a first sacrificial film pattern by etching the first sacrificial film using the first partition mask, forming a first spacer at a sidewall of the first sacrificial film pattern, and forming a first spacer pattern by removing the first sacrificial film pattern. The first partition mask includes a plurality of first line-shaped space patterns extending in a first direction. A width of at least one space pattern located at both edges from among the plurality of first space patterns is smaller than a width of each of other space patterns.

12 Claims, 15 Drawing Sheets

METHOD FOR MANUFACTURING SEMICONDUCTOR DEVICE

CROSS-REFERENCE TO RELATED APPLICATION

This patent document claims the priority and benefits of Korean patent application No. 10-2018-0132751 filed on Nov. 1, 2018, which is hereby incorporated in its entirety by reference.

The technology and implementations disclosed in this patent document relate to a method for forming a semiconductor device, and more particularly to a method for forming a cell array of a phase change semiconductor device to prevent leaning of a phase change structure formed at an outermost patterning part during patterning of the cell array of the phase change semiconductor device.

BACKGROUND

With rapid development of mobile and digital information communication technology and the household appliances industry, it is expected that research into conventional devices based on charge control of electrons will rapidly reach physical limitations. Therefore, new-generation functional memory devices instead of the conventional electron-charge devices are being developed. Especially, in order to satisfy demand for higher storage capacity of each memory for use in principal information devices, next-generation higher-capacity, higher-speed, and lower-power-consumption memory devices are being developed.

In recent times, variable resistance memory devices in which resistor elements are used as memory media have been proposed as next-generation memory devices. Representative examples of the variable resistance memory devices include a phase change memory device, a resistive memory device, and a Spin Transfer Torque Magnetic Random Access Memory (STT-MRAM).

A resistive memory device includes switching elements and resistor elements, and stores data "0" or "1" according to state information of the resistor elements.

SUMMARY

This disclosure provides a method for forming a semiconductor device that substantially obviates one or more problems due to limitations and disadvantages of the related art.

An embodiment of the present disclosure relates to a method for forming a semiconductor device to prevent leaning of a phase change structure formed at an outermost patterning part during patterning of a cell array of a phase change semiconductor device.

In accordance with an aspect of the present disclosure, a method for forming a semiconductor device includes forming a first sacrificial film over a target layer, forming a first partition mask over the first sacrificial film, forming a first sacrificial film pattern by etching the first sacrificial film using the first partition mask, forming a first spacer over a sidewall of the first sacrificial film pattern, and forming a first spacer pattern by removing the first sacrificial film pattern. The first partition mask includes a plurality of first line-shaped spaces extending in a first direction. The width of first edge spaces disposed at edges of the first line-shaped spaces is less than a width of the first line-shaped spaces disposed between the first edge spaces.

In accordance with another aspect of the present disclosure, a method for forming a semiconductor device includes forming a sacrificial film over a target layer, forming a partition mask over the sacrificial film, forming a sacrificial film pattern by etching the sacrificial film using the partition mask, forming a spacer over the sacrificial film pattern, and forming a spacer pattern by removing the sacrificial film pattern. The partition mask includes a plurality of spaces. Sides of outermost spaces from among the plurality of spaces have a shape with a plurality of alternating protrusions and recesses.

It is to be understood that both the foregoing general description and the following detailed description of embodiments are exemplary and explanatory.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

FIGS. 1A to 1G are cross-sectional views illustrating a method for forming a cell array of a phase change memory device according to an embodiment of the disclosed technology.

Figure 1A:
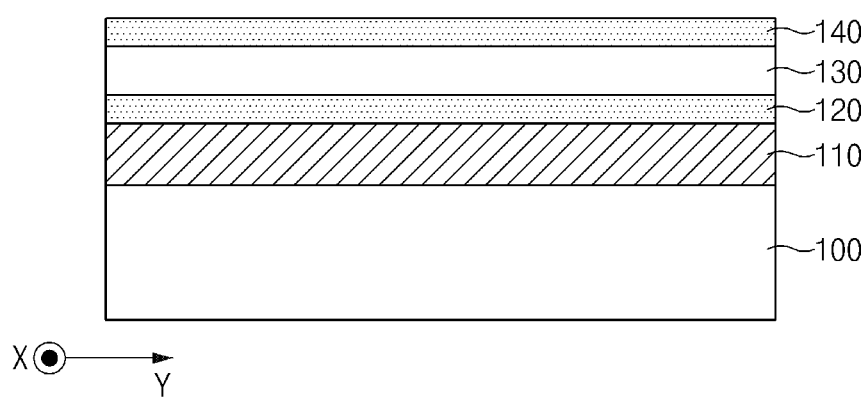
FIGS. 1A to 1G are cross-sectional views illustrating a method for forming a cell array of a phase change memory device according to an embodiment of the disclosed technology.

Referring to FIG. 1A, a conductive material layer 110 and a selection device layer 130 may be formed over a semiconductor substrate 100 including a plurality of lower structures (not shown).

The conductive material layer 110 may include a metal material such as tungsten (W). The conductive material layer 110 may be patterned in a subsequent process, and may thus be used as a word line WL of a phase change memory device.

One electrode layer 140 may be formed over the selection device layer 130, and the other electrode layer 120 may be formed below the selection device layer 130. In other words, as shown in FIG. 1A, the first electrode layer 120, the selection device layer 130, and the second electrode layer 140 may be sequentially stacked over the conductive material layer 110. Each of the electrode layers 120 and 140 may include one or more of aluminum (Al), copper (Cu), tungsten (W), titanium (Ti), tantalum (Ta), titanium tungsten (TiW), titanium aluminum (TiAl), carbon (C), titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), and tantalum carbonitride (TaCN).

The selection device layer 130 may include an ovonic threshold switching (OTS) material layer formed of a specific material which is switched to an on or off state according to a voltage or current applied to the selection device layer 130. When the magnitude of voltage or current applied to the selection device layer 130 is equal to or lower than a predetermined threshold value, the OTS material layer may prevent flowing of such current. When the magnitude of voltage or current applied to the selection device layer 130 is higher than a predetermined threshold value, the OTS material layer may allow such current to flow in proportion to the applied voltage or current. The OTS material layer may be formed of a combination of chalcogenide materials that include tellurium (Te), selenium (Se), germanium (Ge), silicon (Si), arsenic (As), titanium (Ti), sulfur (S), and antimony (Sb). Alternatively, the selection device layer 130 may include a plurality of device layers, each of which is formed of a stacked structure of an N-type oxide semiconductor layer and a P-type oxide semiconductor layer and thus has switching characteristics. For example, the selection device layer 130 may include an NPN or PNP selection device or a P-N diode.

Figure 1B:
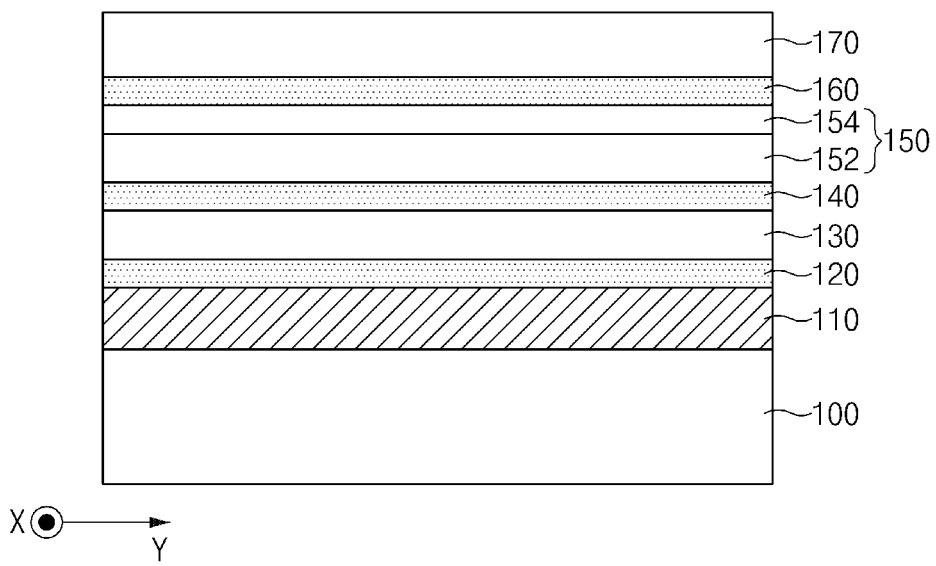

Referring to FIG. 1B, a variable resistance layer 150, an electrode layer 160, and a hard mask layer 170 may be sequentially formed over the electrode layer 140. In this case, the variable resistance layer 150 may include a stacked structure of a variable layer 152 and a metal storage electrode layer 154.

The variable layer 152 may include a variable resistance material layer having variable resistance characteristics. For example, the variable layer 152 may include a phase change material layer. The phase change material layer may be formed of a specific material capable of storing data according to a crystalline state. For example, the phase change material may be formed of a phase change chalcogenide alloy such as germanium antimony tellurium (GST) (e.g., Ge—Sb—Te material such as $Ge_2Sb_2Te_5$, $Ge_2Sb_2Te_7$, $GeSb_2Te_4$, or $GeSb_4Te_7$). In addition, the variable layer 152 may include a binary oxide material provided with a transition metal oxide (TMO), a perovskite-based metal oxide material, a magnetic layer used as a constituent material of a magnetic memory, or a magnetization reversal material layer used as a constituent material of STT-MRAM. For example, the binary oxide material including transition metal oxide (TMO) may include titanium oxide ($TiO_2$), hafnium oxide ($HfO_2$), zirconium oxide ($ZrO_2$), aluminum oxide ($Al_2O_3$), tantalum oxide ($Ta_2O_5$), niobium oxide ($Nb_2O_5$), lanthanum oxide ($La_2O_3$), nickel oxide (NiO), copper oxide (CuO), cobalt oxide ($Co_3O_4$), tungsten oxide ($WO_3$), etc. Examples of the perovskite-based metal oxide material may include $SrTiO_3$(STO), $BaTiO_3$(BTO), $Pr_{1-x}Ca_xMnO_3$(PCMO), etc. The electrode layer 160 may be formed of, for example, the same materials as the first electrode layer 120 and the second electrode layer 140.

Although the variable resistance layer 150 according to the embodiment shown in FIG. 1B is formed over the selection device layer 130, the scope of the present disclosure is not limited thereto, and the variable resistance layer 150 may also be formed below the selection device layer 130.

Figure 1C:
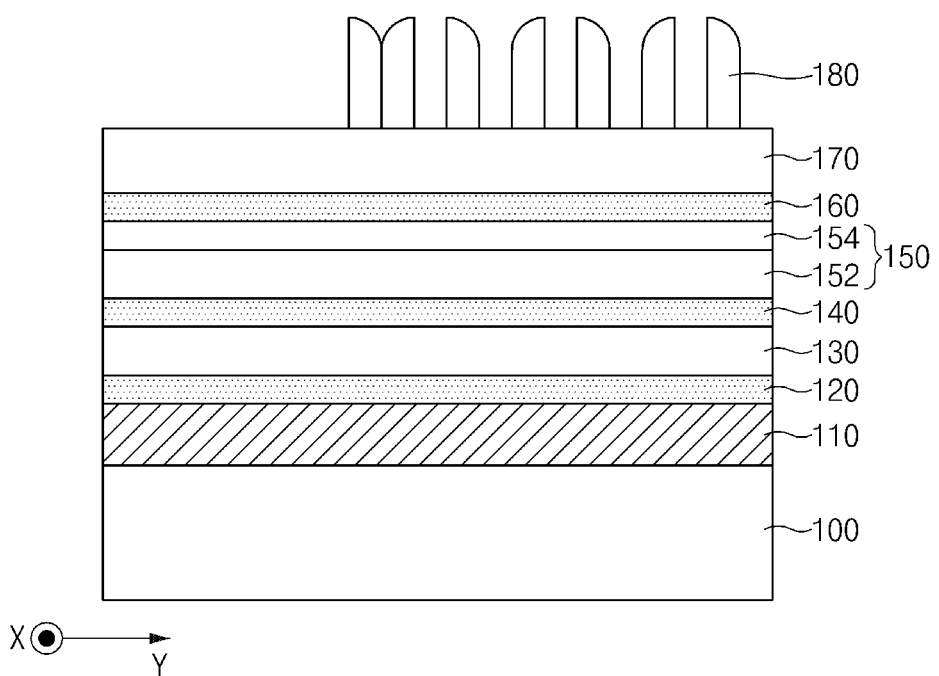

Referring to FIG. 1C, line-shaped mask patterns 180 extending in a first direction (e.g., an X-axis direction) may be formed over a hard mask layer 170 using Spacer Patterning Technology (SPT). In this case, the mask patterns 180 may be formed so that the outermost pattern has a greater width than each of inner patterns.

Figure 2A:
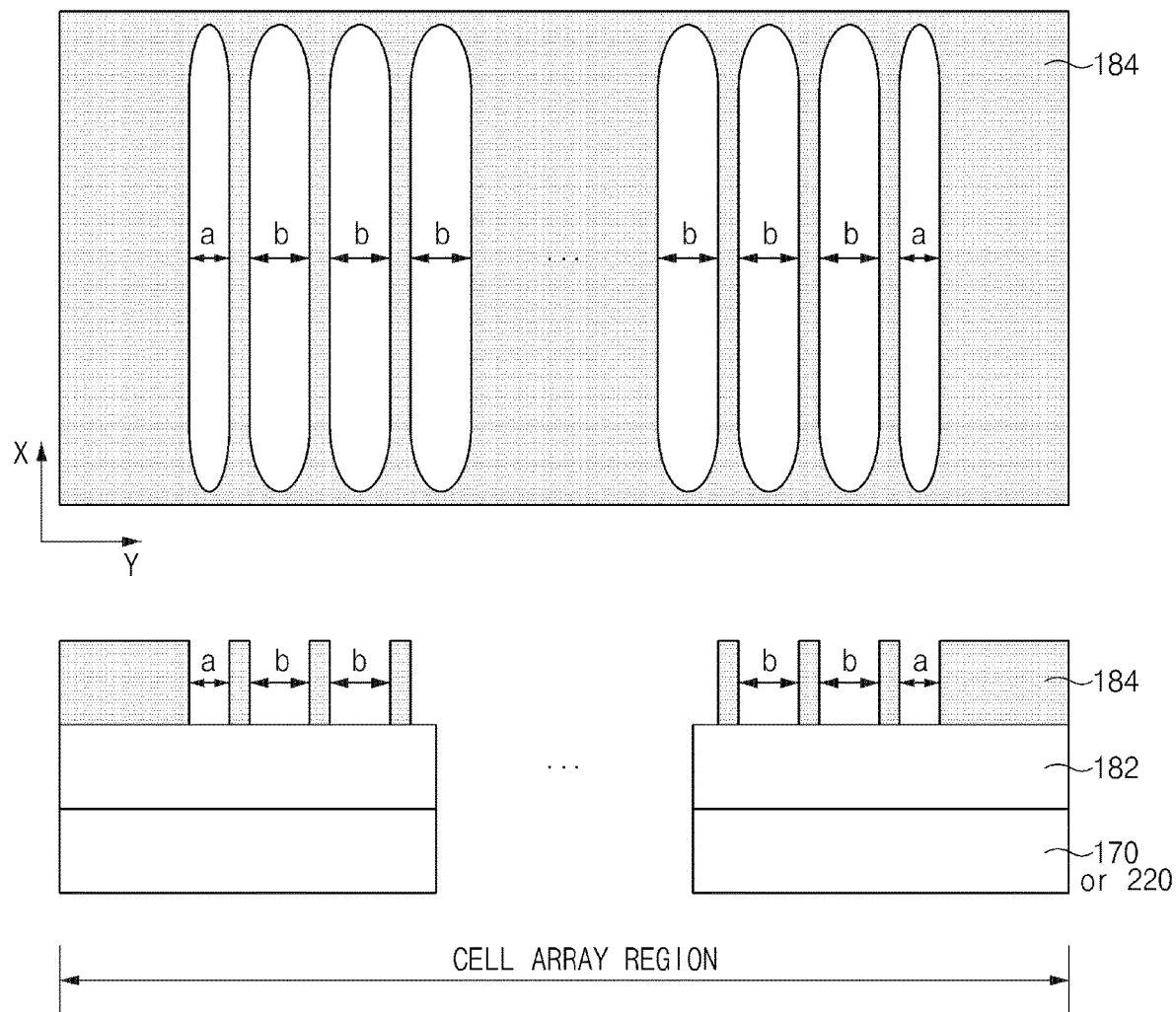
FIGS. 2A to 2C are views illustrating a method for forming a mask pattern according to an embodiment of the disclosed technology.
Figure 2B:
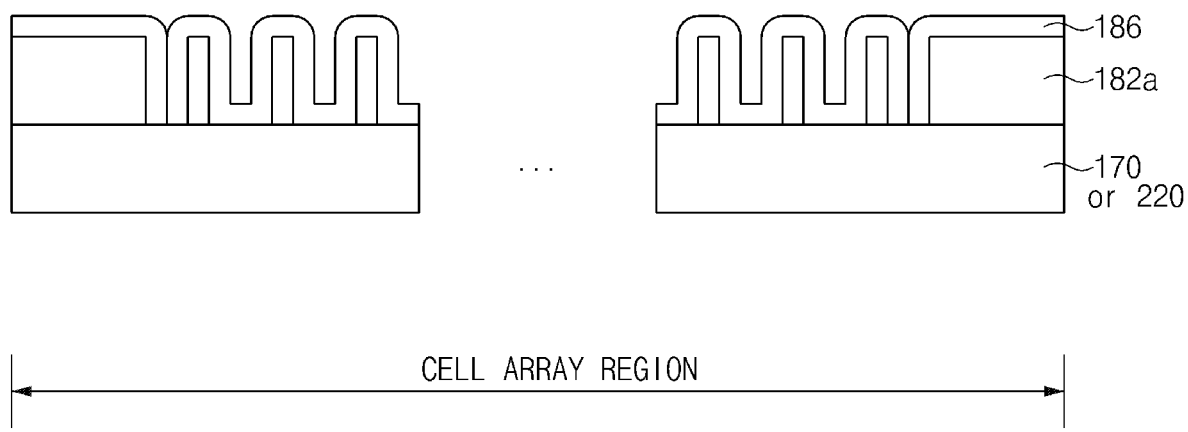
Figure 2C:
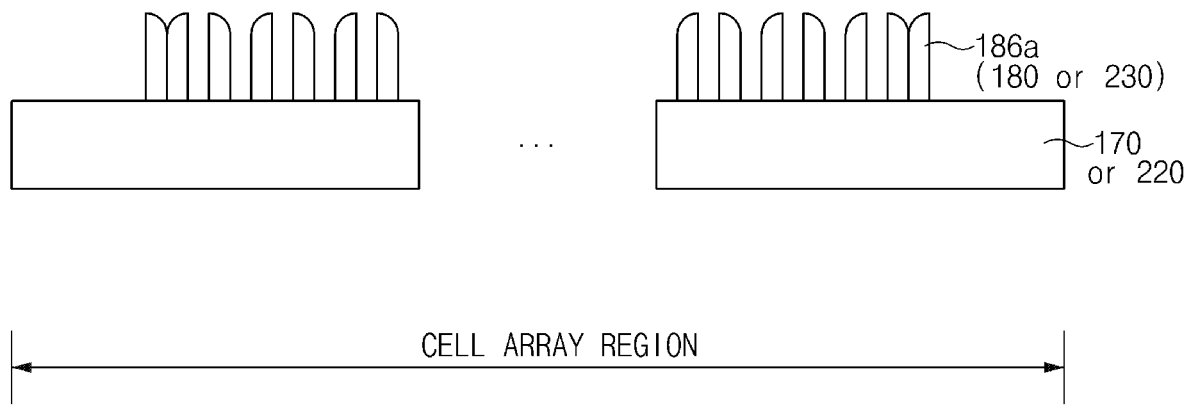

FIGS. 2A to 2C are views illustrating a method for forming the mask pattern 180 according to an embodiment of the disclosed technology.

Referring to FIG. 2A, a sacrificial film 182 may be formed over a hard mask layer 170, and a partition mask 184 may be formed over the sacrificial film 182.

In this case, the sacrificial film 182 may be formed of Spin On Carbon (SOC), and the partition mask 184 may be a photoresist pattern formed by a photolithography process.

Specifically, widths (a) and (b) of line-shaped spaces extending in a first direction from the partition mask 184 may be non-uniformly formed in a cell array region. The width (a) of each outermost space formed at opposing outermost edges of the partition mask 184 may be smaller than the other width (b) of each space formed between the outermost spaces, as represented by "a<b". In this case, the spaces may be spaced apart from each other by the same distance. In other words, the distance between every two adjacent spaces in a space pattern may be the same.

For example, the width (a) of both outermost spaces of the partition mask 184 may be smaller than the width (b) of each of the remaining spaces formed between both outermost spaces. In this case, in a subsequent spacer formation process, the width (a) of the outermost space may have a specific length (for example, a length corresponding to about twice the spacer width) that allows side surfaces of spacers formed in the corresponding space to be brought into contact with each other. Here, the term "about" refers to normal engineering tolerances to accommodate minor variations from the target width, e.g. the width of two spacers. That is, the width (a) of the outermost space may be appropriately sized to facilitate proper formation of spacers formed in a subsequent process. Alternatively, the width (a) of the outermost space may be greater than the width of a spacer so that respective spacers are located very close to each other without being laterally in contact with each other such that the corresponding spacers can function as a single pattern.

The reason why each outermost space is formed to have the width (a) as described above is to increase a width of pattern formed at edges of a cell array. The increased width of pattern at edges of the cell array helps to protect cell structures from being damaged in an etching process.

Referring to FIG. 2B, the sacrificial film 182 may be etched by an etching process in which the partition mask 184 is used as an etch mask, thereby sacrificial film pattern 182a, which may be referred to as a partition pattern.

Subsequently, a spacer insulation film 186 may be formed over the sacrificial film pattern 182a and the hard mask layer 170. The spacer insulation film 186 may be deposited over sidewalls of the sacrificial film pattern 182a. The spacer insulation film 186 may be formed by conformally depositing a material having an etch rate selectivity that is different from that of the sacrificial film pattern 182a. For example, when the sacrificial film pattern 182 is formed of Spin On Carbon (SOC) having carbon (C), the spacer insulation film 186 may be formed of an Ultra Low Temperature Oxide (ULTO).

Referring to FIG. 2C, the spacer insulation film 186 may be anisotropically etched until a top surface of the sacrificial film pattern 182 is exposed outside, the exposed sacrificial film pattern 182a is removed such that a spacer pattern 186a may be formed over the hard mask layer 170. The sacrificial film pattern 182a may be removed by an etch-back process using an etch selection ratio between the sacrificial film pattern 182a and the spacer pattern 186a.

The spacer pattern 186a may be identical to the mask pattern 180 of FIG. 1C. In other words, the mask pattern 180 that comprises a plurality of spacers may be alternately referred to as a mask pattern 180 because it functions as a mask, or a spacer pattern 186a because it is a pattern of spacers.

Referring back to FIG. 1D, the hard mask layer 170 may be etched using the mask pattern 180, which is formed by the fabrication methods shown in FIGS. 2A to 2C, as an etch mask, thereby forming a hard mask pattern 170a. Subsequently, the electrode layer 160, the variable resistance layer 150, the electrode layer 140, the selection device layer 130, the electrode layer 120, and the conductive material layer 110 may be sequentially etched using the hard mask pattern 170a as an etch mask, such that an electrode layer 160a, a variable resistor 150a, an electrode layer 140a, a selection device 130a, an electrode 120a, and a conductive line 110a may be formed.

Figure 1D:
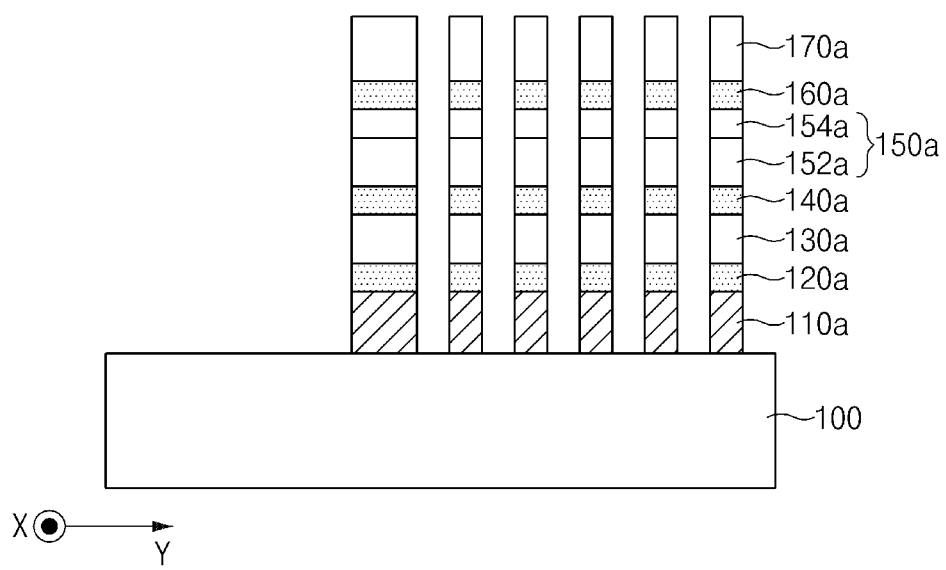

That is, the patterned electrode 160a, the variable resistor 150a, the electrode 140a, the selection device 130a, the electrode 120a, and the conductive line 110a may be formed in a line pattern extending in a first direction. Although the hard mask pattern 170a is illustrated in FIG. 1D for convenience of description, the scope of the present disclosure is not limited thereto, and the hard mask pattern 170a may be removed in a patterning process. The conductive line 110a may function as a word line (WL) of the phase change memory device.

For convenience of description and better understanding of the present disclosure, the line-shaped electrode 160a and the line-shaped variable resistor 150a may be integrated into a single group and this group will hereinafter be referred to as a phase change line. In addition, the line-shaped electrode 140a, the line-shaped selection device 130a, and the line-shaped electrode 120a may be integrated into a single group and this group will hereinafter be referred to as a switching line.

Figure 3:
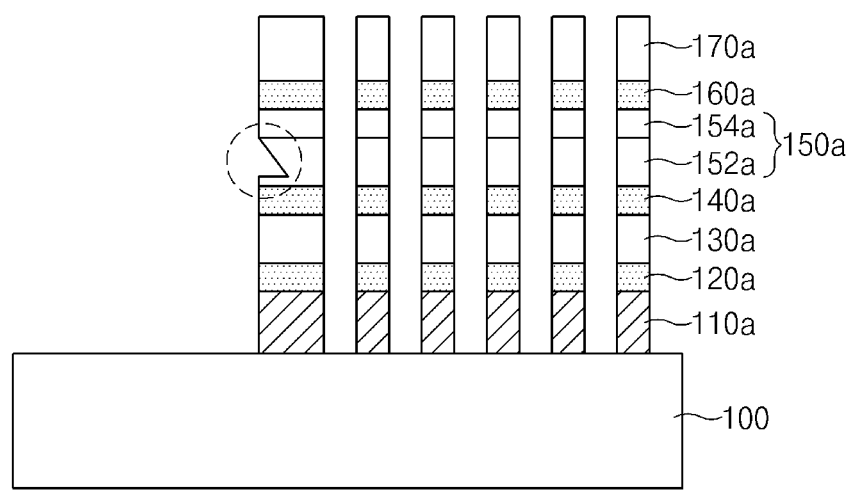
FIG. 3 is an exemplary view illustrating that a phase change material layer of an outermost pattern is damaged by an etchant.

However, in the above patterning process, there is a high possibility that the outermost pattern formed at the outermost edge is more damaged by an etchant than inner patterns. That is, the inner patterns are spaced apart from each other by a very short distance such that there is a low probability that the inner patterns are damaged by the etchant. In contrast, the outer space located outside the outermost pattern may be relatively large, such that there is a high probability that a variable resistance material layer (especially, a phase change material layer such as GST) of the outermost pattern is damaged by the etchant as shown in the dashed line circle of FIG. 3.

Therefore, when the outermost pattern is formed to have the same width as each of the inner patterns, a fault or defect may occur in the semiconductor device due to leaning of the outermost pattern.

In order to prevent leaning of the outermost pattern, an embodiment may form a protective pattern at the outermost edge, and may allow the outermost pattern (i.e., protective pattern) to be wider than each of the inner patterns. As a result, even when the outermost pattern is damaged, the outermost pattern is prevented from leaning.

Although only the outermost pattern formed on one side of a cell array is shown in FIGS. 1C and 1D for convenience of description and better understanding of the present disclosure, the scope of the present disclosure is not limited thereto. Each of the outermost patterns located at opposite sides of the cell array may be wider than central structures in the cell array as illustrated in FIGS. 2A to 2C.

Figure 1E:
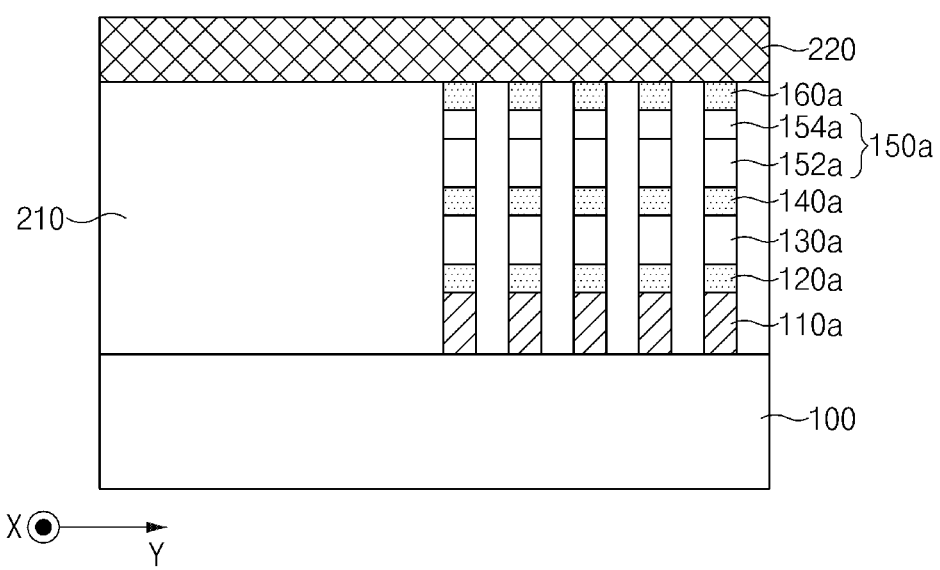

Referring to FIG. 1E, the outermost patterns formed at both sides of the cell array may be removed using a cut mask. Subsequently, an insulation film 210 may be formed over a semiconductor substrate 100, a conductive line 110a, a plurality of switching lines 120a, 130a, and 140a, a plurality of phase change lines 150a and 160a, and a hard mask pattern 170a. The insulation film 210 may be planarized by a planarization process (e.g., a Chemical Mechanical Polishing (CMP) process) until upper surfaces of the electrode 160a are exposed.

The insulation film 210 may have a monolayer or multilayer structure that is formed of various insulation materials, for example, an oxide material, a nitride material, or a combination thereof.

Subsequently, a metal film 220 may be formed over the planarized insulation film 210 and the electrode 160a. The metal film 220 may be electrically coupled to the electrode 160a.

Figure 1F:
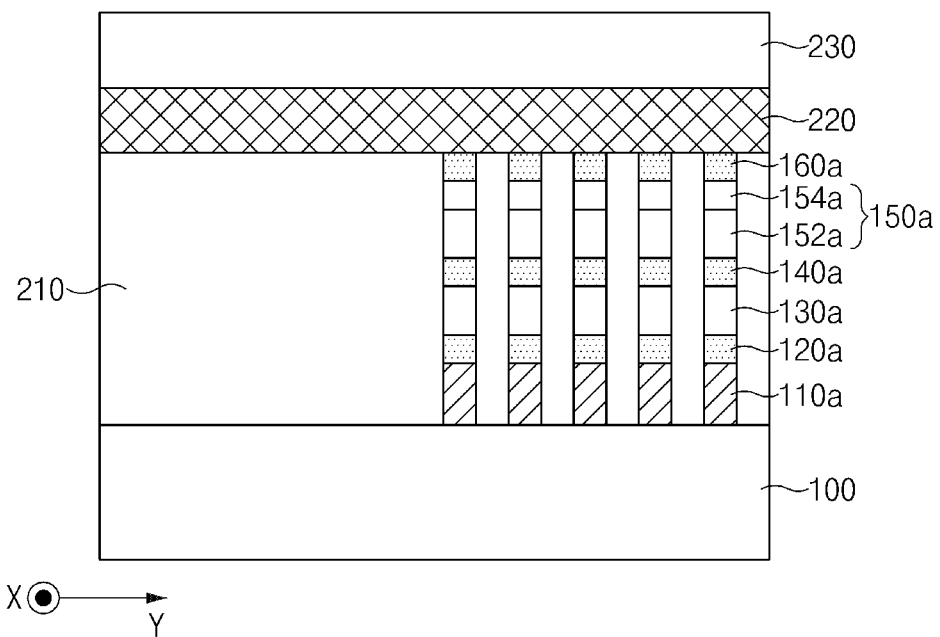

Referring to FIG. 1F, a line-shaped mask pattern 230 extending in a second direction (e.g., a Y-axis direction) perpendicular to the first direction may be formed over the metal film 220.

Figure 4:
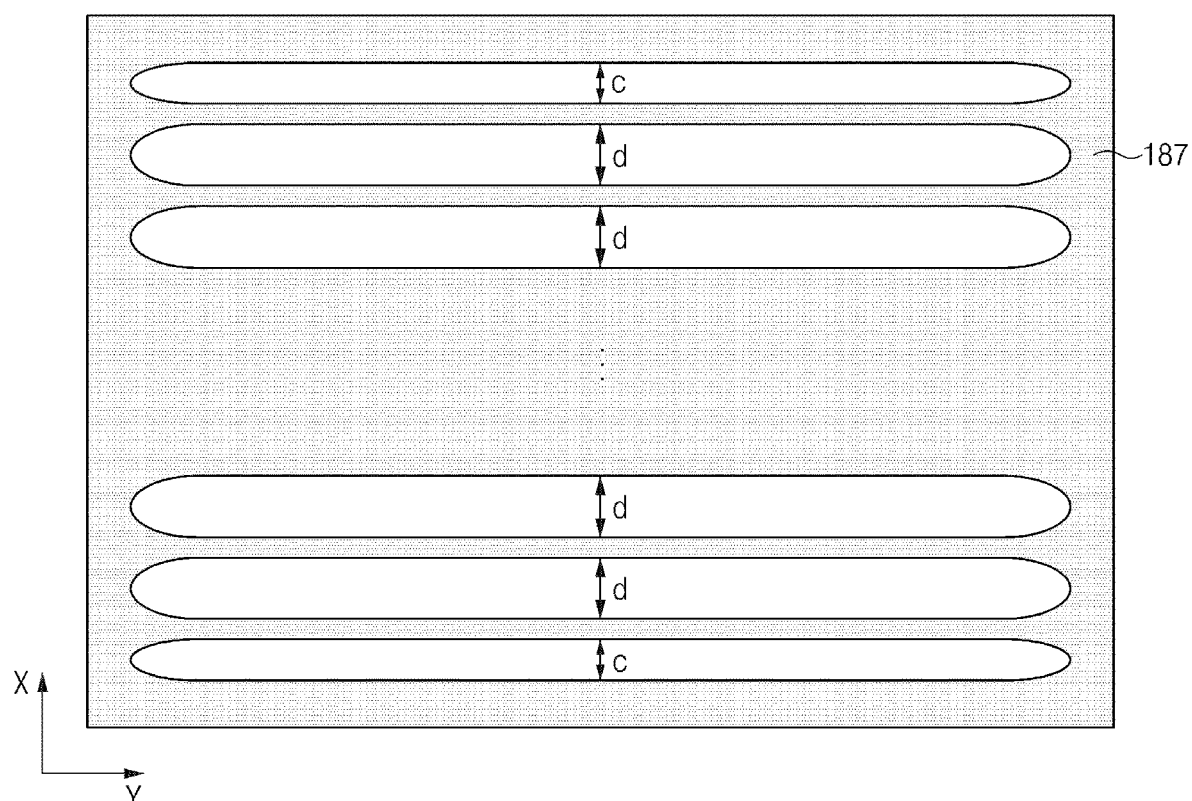
FIG. 4 is a structural view illustrating a partition mask for forming a mask pattern extending in a Y-axis direction according to an embodiment of the disclosed technology.

The mask pattern 230 may be formed using Spacer Patterning Technology (SPT), as shown in FIGS. 2B and 2C, using a partition mask 187 in which line-shaped spaces extending in the second direction are formed as shown in FIG. 4. In this case, the width (a) and (b) of the spaces formed in the partition mask 187 may be non-uniformly formed in the cell array region. The width (c) of each of the outermost space patterns formed at the outermost edges of the partition mask 187 may be smaller than the width (d) of each of the space patterns formed between the outermost space patterns, as represented by "c<d". In an embodiment, the spaces may be spaced apart from each other by the same distance.

That is, the outermost patterns of the mask pattern 230 may be formed to interconnect two spacers, such that each outermost pattern is formed to have a larger width than each inner pattern formed of only one spacer. An example of two interconnected spacers can be seen in FIG. 2C, where the outermost two spacers on both sides of the spacer pattern 186a are touching.

Due to the similarities between forming mask pattern 180 and mask pattern 230, a detailed description of the method for forming the mask pattern 230 will herein be omitted for convenience of description.

Figure 1G:
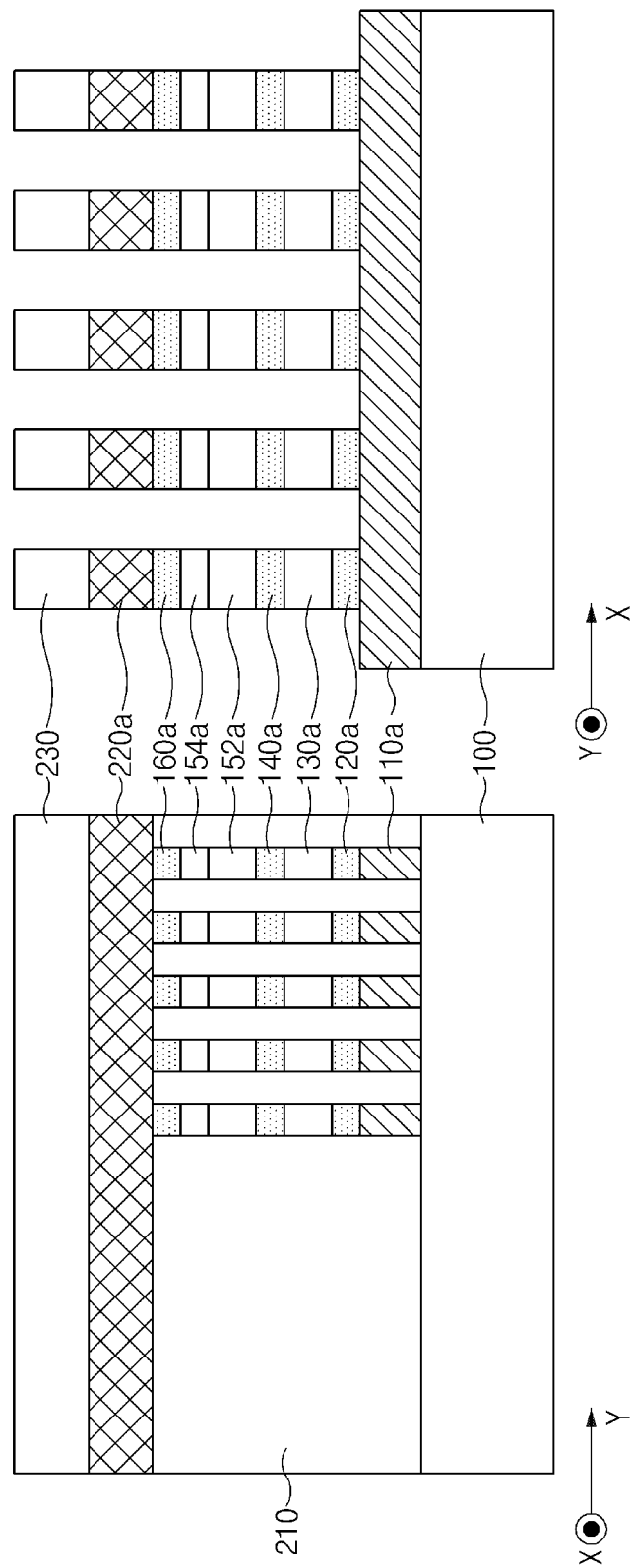

Referring to FIG. 1G, the metal film 220 may be etched using the mask pattern 230 as an etch mask, resulting in formation of a conductive line 220a. Phase change lines 160a and 150a formed below the conductive line 220a and the switching lines 140a, 130a, and 120a may be sequentially etched, such that cell-isolated phase change patterns and switching patterns corresponding to the respective phase change patterns may be formed.

That is, a plurality of phase change layers and switching layers may be formed between word lines 110a and bit lines 220a that are oriented perpendicular to the word lines 110a.

Protective patterns at the outermost edge having a larger width than central lines may be removed by a cut mask.

Figure 5:
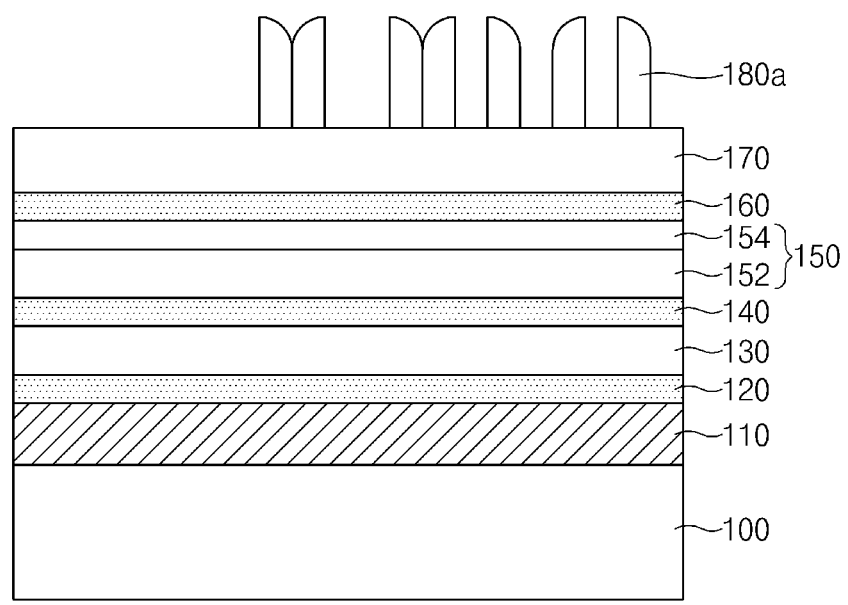
FIG. 5 is a structural view illustrating a mask pattern according to another embodiment of the disclosed technology.

FIG. 5 is a structural view illustrating a mask pattern according to another embodiment of the disclosed technology.

Referring to FIG. 5, for implementation of more stable patterning, a mask pattern 180a may be configured so that two masking elements at each of the outermost edges of the pattern are larger than masking elements in the middle of the pattern. For example, as seen in FIG. 5, the two sets of spacers on the left edge of the pattern each comprise two connected spacers so that those elements are twice as wide as the elements in the middle of the spacer pattern, which each have a single spacer.

Figure 6:
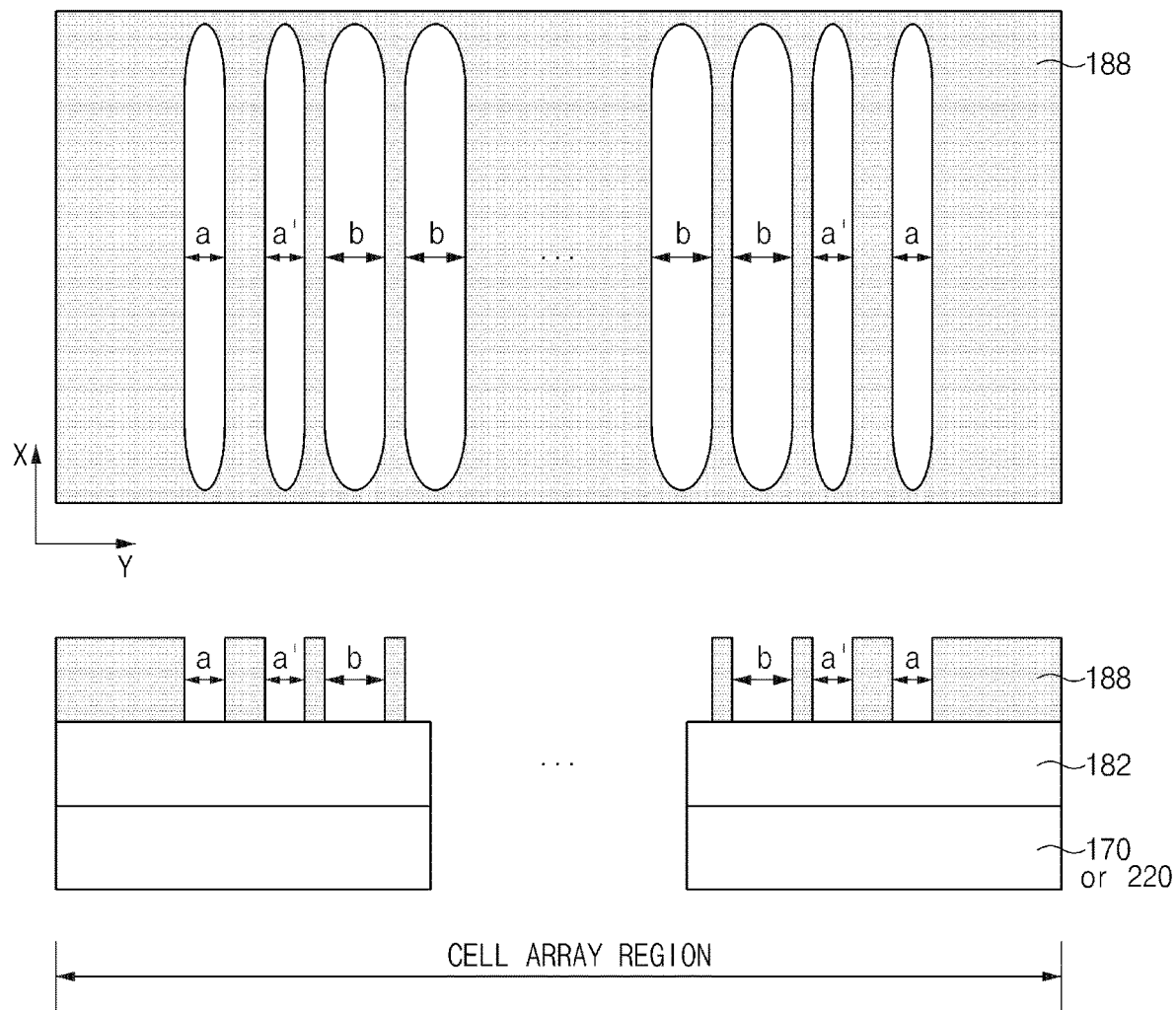
FIG. 6 is a structural view illustrating a partition mask according to another embodiment of the disclosed technology.

In the partition mask 188 for SPT fabrication shown in FIG. 6, each of the width (a) of an outermost space and the width (a') of a space located adjacent to the outermost space is smaller than the width (b) of each of other inner spaces located closer to the center of the partition mask 188, resulting in formation of the mask pattern 180a in FIG. 5. In various embodiments, the width (a) of the outermost space and the width (a') of the contiguous space located adjacent to the outermost space may be the same or different from each other.

The mask pattern 180a of FIG. 5 may be formed by performing SPT fabrication as shown in FIGS. 2B and 2C using the partition mask 188 of FIG. 6. Therefore, a detailed description of the method for forming the mask pattern 180a will be omitted for convenience of description.

Figure 7:
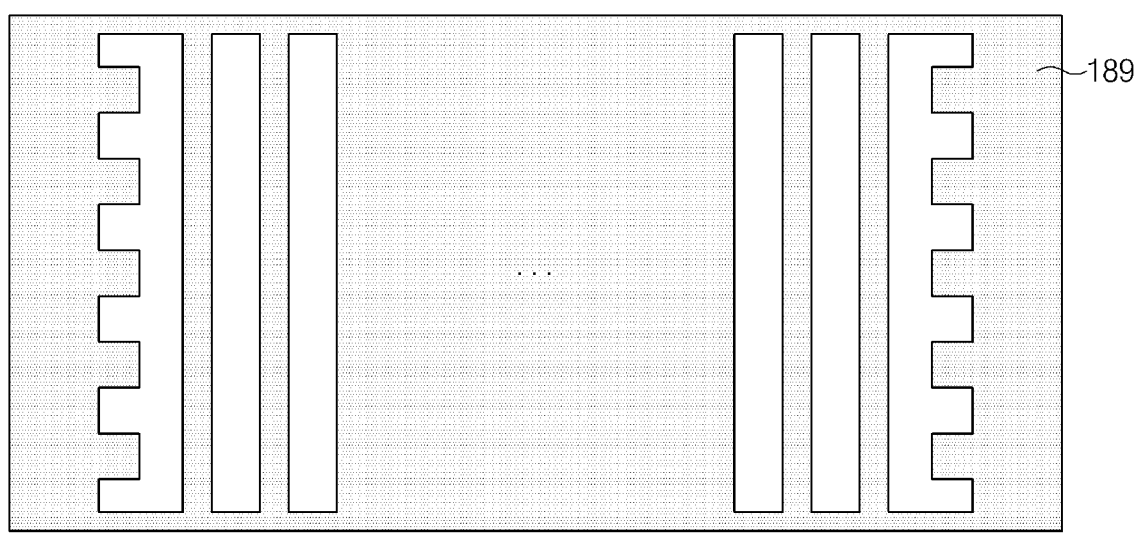
FIG. 7 is a structural view illustrating a partition mask according to yet another embodiment of the disclosed technology.

FIG. 7 is a structural view illustrating a partition mask according to yet another embodiment of the disclosed technology.

Referring to FIG. 7, a spacer patterning technology (SPT) partition mask 189 may have an alternating series of protrusions and recesses. For example, the outer sidewalls of the outermost spaces in the space pattern shown in partition mask 189 of FIG. 7 have an alternating series of protrusions and recesses.

As illustrated in FIG. 7, since the outer sidewall of the outermost space of the partition mask 189 has a series of protrusions and recesses, spacers located in a series of protrusions and recesses may be formed to contact each other, or may be located very close to each other. As seen in the figure, the alternating protrusions and recesses are oriented away from the plurality of spaces.

As a result, each of the outermost patterns of the mask pattern may be formed to have a larger width than each of other inner patterns.

As is apparent from the above description, methods for forming semiconductor devices according to embodiments of the present disclosure may prevent leaning of a phase change structure formed at an outermost patterning part during patterning of a cell array of a phase change semiconductor device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A method for forming a semiconductor device comprising:
   forming a first sacrificial film over a target layer;
   forming a first partition mask over the first sacrificial film;
   forming a first sacrificial film pattern by etching the first sacrificial film using the first partition mask;
   forming a first spacer over a sidewall of the first sacrificial film pattern; and
   forming a first spacer pattern by removing the first sacrificial film pattern,
   wherein the first partition mask includes a plurality of first line-shaped spaces extending in a first direction, and
   wherein a width of first edge spaces disposed at edges of the first line-shaped spaces is less than a width of the first line-shaped spaces disposed between the first edge spaces.

2. The method according to claim 1, wherein the first edge spaces include both outermost spaces from among the plurality of first line-shaped spaces.

3. The method according to claim 2, wherein the first edge spaces further include:
   spaces located adjacent to each of the outermost spaces.

4. The method according to claim 1, wherein forming the first spacer includes depositing a first spacer film so it completely covers regions corresponding to the first edge spaces in the first sacrificial film pattern.

5. The method according to claim 4, wherein the width of the first edge spaces is about twice a width of the first spacer.

6. The method according to claim 1, wherein the target layer includes:
   a selection device layer; and
   a variable resistance layer formed over or below the selection device layer.

7. The method according to claim 6, wherein the selection device layer includes an ovonic threshold switch (OTS) material layer.

8. The method according to claim 7, wherein the selection device layer further includes:
   an electrode layer formed over or below the selection device layer.

9. The method according to claim 6, wherein the variable resistance layer includes a phase change material layer.

10. The method according to claim 9, wherein the phase change material layer includes a germanium antimony tellurium (GST) material.

11. The method according to claim 1, further comprising:
forming a line-shaped target layer pattern comprising line-shaped structures extending in the first direction by etching the target layer using the first spacer pattern;
forming a metal film over the target layer pattern;
forming a second sacrificial film over the metal film;
forming a second partition mask over the second sacrificial film;
forming a second sacrificial film pattern by etching the second sacrificial film using the second partition mask;
forming a second spacer over a sidewall of the second sacrificial film pattern; and
forming a second spacer pattern by removing the second sacrificial film pattern,
wherein the second partition mask includes a plurality of second line-shaped spaces extending in a second direction perpendicular to the first direction, and
wherein a width of second edge spaces disposed at edges of the second line-shaped spaces is less than a width of second line-shaped spaces disposed between the second edge spaces.

12. The method according to claim 11, further comprising:
forming a conductive line by etching the metal film in the second direction using the second spacer pattern; and
forming a memory cell by etching a portion of the target layer pattern exposed by the conductive line in the second direction.

* * * * *